US006566714B2

(12) United States Patent
Deane et al.

(10) Patent No.: US 6,566,714 B2
(45) Date of Patent: May 20, 2003

(54) ELECTRONIC DEVICE INCLUDING A THIN FILM TRANSISTOR

(75) Inventors: Steven C. Deane, Redhill (GB); Pieter J. Van der Zaag, Pyrford (GB); Stephen J. Battersby, Haywards Heath (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 4 days.

(21) Appl. No.: 10/142,619

(22) Filed: May 9, 2002

(65) Prior Publication Data

US 2002/0167051 A1 Nov. 14, 2002

(30) Foreign Application Priority Data

May 10, 2001 (GB) .............................................. 0111423

(51) Int. Cl.[7] .......................... H01L 27/01; H01L 27/12; H01L 31/0392
(52) U.S. Cl. .......................... 257/350; 257/59; 257/72; 257/329; 257/347
(58) Field of Search .......................... 257/59, 72, 329, 257/347, 350

(56) References Cited

U.S. PATENT DOCUMENTS

| 4,633,284 | A |  | 12/1986 | Hansell et al. ............. 357/23.7 |
| 5,130,829 | A |  | 7/1992 | Shannon ....................... 359/59 |
| 5,936,259 | A |  | 8/1999 | Katz et al. ..................... 257/40 |
| 5,995,189 | A |  | 11/1999 | Zhang ........................ 349/153 |
| 6,184,556 | B1 | * | 2/2001 | Yamazaki et al. .......... 257/354 |
| 6,225,197 | B1 | * | 5/2001 | Maekawa .................... 438/487 |

FOREIGN PATENT DOCUMENTS

| EP | 1041653 A2 | 4/2000 | ........... H01L/51/20 |
| WO | WO9912989 | 3/1999 | ........... C08G/61/12 |
| WO | WO0079617 | 12/2000 | ........... H01L/51/20 |

OTHER PUBLICATIONS

"Short Channel a–Si Thin Film MOS Transistors" by Y. Uchida et al, IEEE Transactions on Electron Devices, vol. 36, No. 12, Dec. 1989.
"Improved Off–characteristics of a–Si Vertical–type MOS-FETs" by H. Okada et al, Mat. Res. Soc. Symp. Proc., vol. 118 (1988), pp. 219 to 224.
Proposed Vertical–Type Amorphous–Silicon Field–Effect Transistors' by Y. Uchida et al, IEEE Electron Device Letters, vol. EDL–5, No. 4, Apr. 1984, pp. 105–107.
"Vertical–Type Amorphous–Silicon Field–Effect Transistors with Small Parasitic Elements", Y. Uchida et al, JJAP, vol. 25, No. 9, Sep. 1986, pp. 798–800.

* cited by examiner

*Primary Examiner*—Ngân V. Ngô

(57) ABSTRACT

Short channel thin film transistors suffer from unacceptably high leakage currents. The invention provides an electronic device including a thin film transistor in which the length (20) of the channel of the transistor is 1 μm or less, and the mobility of the semiconductor material in the channel is less than 0.2 cm²/Vs. The selection of a low mobility semiconductor material results in acceptable off-current characteristics and its effect on the switching speed of the device is compensated for by the short channel length (20) of the device.

14 Claims, 3 Drawing Sheets

ELECTRONIC DEVICE INCLUDING A THIN FILM TRANSISTOR

The present invention relates to electronic devices comprising thin film transistors (TFTs) on an insulating substrate, for example, a glass or insulating polymer substrate. The device may be, for example, an active matrix liquid crystal display (AMLCD) or other flat panel display.

For many years there has been considerable interest in developing thin-film circuits with TFTs on glass and/or on other inexpensive insulating substrates, for large area electronics applications. Such TFTs fabricated with amorphous or polycrystalline semiconductor films may form the switching elements of a cell matrix, for example, on the active plate of a flat panel display as described in U.S. Pat. No. 5,130, 829 (Our Ref: PHB 33646).

TFTs are formed by the successive deposition of layers of different materials. The channel length of a TFT is typically defined by a photolithographic process. A shorter channel length is generally preferable as this increases the switching speed of the device. In the fabrication of TFTs for large area applications, the resolution of the processing steps need to be maintained across relatively large substrates. The photolithographic machines currently available for AMLCD manufacture on glass plates are only able to produce TFT arrays in which the channel lengths of the TFTs are 5 $\mu$m or more. Whilst devices formed by these machines are adequate for the switching elements in current displays, in order to make devices more cost effectively, particularly for applications such as liquid crystal televisions, it is desirable to use low resolution patterning techniques such as printing. However, these techniques do not currently yield TFTs with suitable performance.

Research carried out in relation to TFTs having submicron channel lengths has also revealed that the devices suffer from high off-currents. This problem is noted in a paper entitled "Short Channel a-Si Thin Film MOS Transistors" by Y. Uchida et al in IEEE Transactions on Electron Devices, Vol. 36, No. 12, December 1989. If such devices are used as the switching elements of AMLCDs, this leads to poor image retention.

It has been suggested that vertical TFTs, in which the channel extends substantially vertically relative to the substrate might provide a practical way of providing shorter channel lengths over large areas. The length of the channel in such a device is not limited by any photolithographic process, but by the thickness of one or more of the device layers. However, the same problem as described above in relation to short channel lateral TFTs has been observed. This is discussed for example in "Improved Off-characteristics of a-Si Vertical-type MOSFETs" by H. Okada et al published in Mat. Res. Soc. Symp. Proc., Vol. 118 (1988), pages 219 to 224.

It is an object of the invention to provide an electronic device including a TFT which exhibits improved operational characteristics.

The present invention provides an electronic device including a TFT comprising an insulated gate adjacent to a layer of semiconductor material for controlling a conduction channel in the semiconductor layer between source and drain regions, wherein the length of the channel region of the transistor is 1 $\mu$m or less, and the mobility of the semiconductor material in the channel region is less than 0.2 cm$^2$/Vs.

The term "mobility" as used herein refers to the field effect mobility of the semiconductor material in the channel region of the TFT excluding the effect of any contact resistance within the TFT. This mobility may for example be measured by examining a TFT formed using the same semiconductor material but with a long channel, typically 50 microns or more, in which the influence of contact resistance is sufficiently small relative to the resistance of the channel.

As noted above, it is desirable to improve the switching speed of TFTs and so there has been pressure to increase the mobility of the semiconductor material used in TFTs. However, the present inventors realised that the use of material having a mobility less than 0.2 cm$^2$/Vs in transistors having a channel length less than 1 micron substantially improves the off-current characteristics thereof. The channel length and mobility may therefore be selected within these ranges such that, at predetermined gate and drain voltage limits, the leakage current through the transistor does not exceed a predetermined threshold.

The switching speed of a TFT is proportional to its mobility and inversely proportional to the square of its channel length. Thus, the effect of using low mobility semiconductor material on the TFT speed is compensated for in a short channel transistor by its short channel length. For example, reducing the channel length of a transistor from 5 microns to 0.25 micron, say, increases the switching speed by a factor of 400, and therefore is able to compensate for a substantial reduction in mobility.

Preferably, the length of the channel region of the transistor is around 0.75 micron or less, or more particularly, around 0.5 micron or less.

The mobility of the semiconductor material in the channel region is preferably around 0.15 cm$^2$/Vs or less, or more particularly, around 0.1 cm$^2$/Vs or less.

Typically, in an existing AMLCD, the maximum acceptable leakage current is around 1 pA. That is, it is undesirable for the TFT off-current to exceed this value during normal operation of the display as otherwise the current leakage will lead to significant degradation of the display output. This threshold may vary somewhat depending on the characteristics of the picture element associated with the TFT.

Once a pixel associated with the TFT has been fully charged, a typical value for the predetermined voltage difference between the source and drain (hereinafter the "source-drain voltage") of the TFT is around 10V. Accordingly, for the TFT performance to be acceptable, the maximum off-current threshold should not be exceeded under these circumstances. Similarly, the maximum negative gate electrode which a TFT may experience in a typical AMLCD is around −15V, and so the TFT should not exceed the off-current threshold at this limit.

In a preferred embodiment, the transistor is a vertical transistor. In addressing the issue of excessive off-current leakage in short channel transistors, the invention solves a problem associated with vertical TFTs which has substantially precluded their use in practical applications.

As noted above, the channel length of a vertical TFT is determined by the thickness of one or more layers of the device. Using current processing technology, the thickness of a layer may be accurately controlled down to around 0.1 micron or even as low as 0.05 micron. Below these values, it is at present difficult to ensure a reliable layer thickness, particularly over a large area substrate. The processing techniques currently available impose similar lower limits on the channel length of lateral TFTs, with lengths below 0.1 micron difficult to achieve reliably across large areas.

The semiconductor material used to form the transistor channel may comprise amorphous silicon. The mobility of amorphous silicon may be selected to be as low as 0.01 cm$^2$/Vs or less. Nanocrystalline silicon may also be used. Furthermore, the semiconductor material may comprise a printable inorganic material, for example formed by deposition of a solution of cadmium selenide nanocrystals.

In other preferred embodiments, the semiconductor material may comprise an organic, or more particularly, a polymeric material. An example of a suitable organic semiconductor is pentacene, whilst a suitable polymeric semiconductor is poly-2,5-thienylene vinylene. If a device in which the transistor body is formed of an organic semiconductor material is fabricated with a short channel length and low mobility in accordance with the invention, it may provide an acceptable off-current performance. Polymeric semiconductors may be used with mobilities as low as 0.001 to 0.0001 $cm^2/Vs$. In a further preferred embodiment, the semiconductor material may comprise an organic-inorganic hybrid material.

Vertical TFTs are susceptible to fabrication using a low definition process, as the channel length is not defined by the precise patterning of a particular layer, but by the thickness of one or more layers of the device. As will be appreciated by the skilled person, photolithography is a high definition process, whilst a low definition process may be a printing process such as gravure-offset printing, inkjet printing, or micro-dispensing. Thus, in overcoming a problem associated with vertical TFTs per se, the invention also enables the fabrication of a short channel, vertical TFT which does not require the use of expensive high definition processes and has operational characteristics acceptable for use in a large area device.

TFT configurations and the invention will now be described by way of example and with reference to the accompanying schematic drawings and graphs, wherein.

Figure 1:
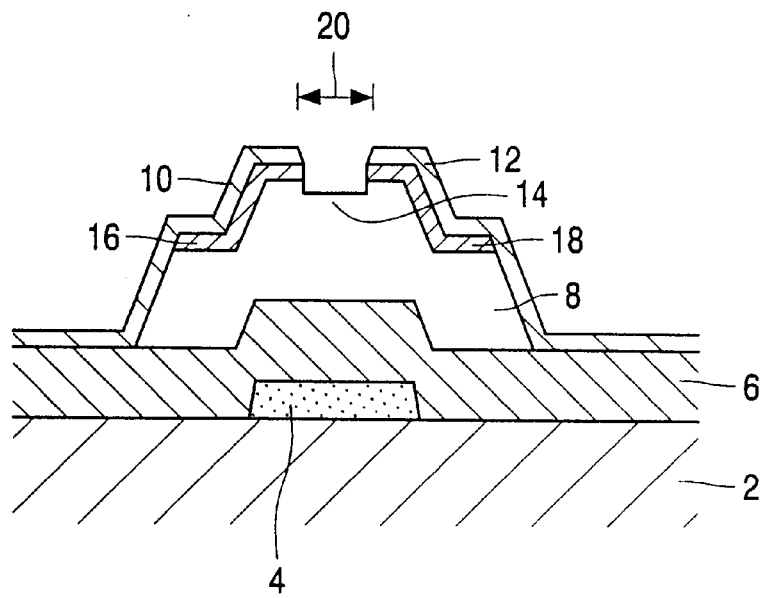
FIG. 1 shows a typical lateral TFT configuration.
Figure 2:
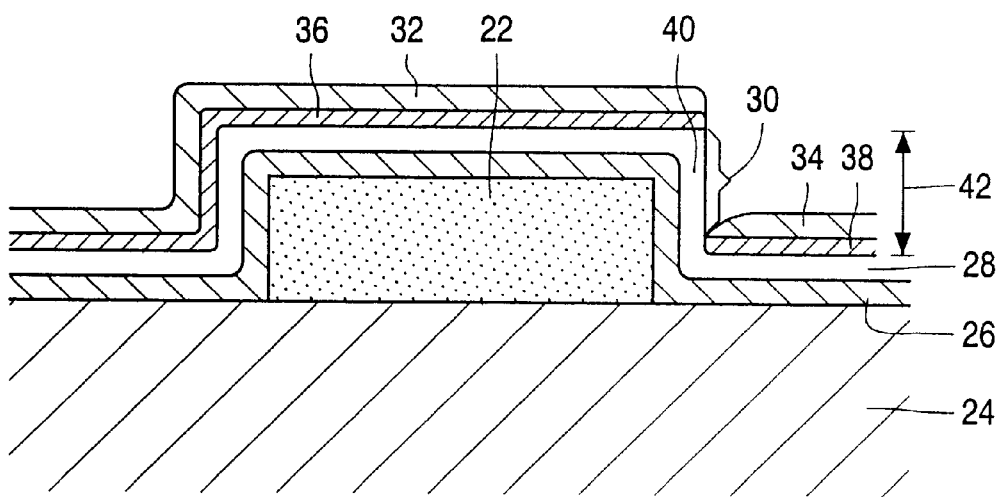
FIG. 2 shows a vertical TFT configuration.

It should be noted that the FIGS. 1 and 2 are diagrammatic and not drawn to scale. Relative dimensions and proportions of parts of these Figures have been shown exaggerated or reduced in size, for the sake of clarity and convenience in the drawings.

FIG. 1 shows a typical lateral back channel etch TFT configuration, in particular, a back channel etch TFT, formed on an insulating substrate 2. It comprises a gate electrode 4, and an overlying gate insulator layer 6. An island 8 of semiconductor material is provided on the gate insulator layer 6. Source and drain regions in the form of source and drain electrodes 10 and 12 are provided on either side of the conduction channel 14 of the transistor. Contact layers 16 and 18 are included between each electrode and the semiconductor material. The length 20 of the conduction channel is defined by the spacing of the source and drain electrodes 10 and 12, which are typically patterned using photolithography. The structure and manufacture of such a device per se is well known in the art and shall not therefore be discussed in further detail.

FIG. 2 shows a vertical TFT configuration which is the subject of copending United Kingdom Patent Application No 0111424.8 filed by the present applicant. The contents of that application are hereby incorporated herein. The TFT comprises a gate electrode 22 formed on an insulating substrate 24. Provided over the gate electrode in turn are a gate insulator layer 26 and a layer of semiconductor material 28, resulting in a step 30 in the semiconductor layer adjacent the edge of the gate electrode 22. One of the source and drain electrodes 32, 34 extends over the gate electrode 22 and semiconductor layer 28 to the upper edge of the step 30, whilst the other extends up to the foot of the step. Contact layers 36 and 38 are provided under the source and drain electrodes. The transistor channel 40 extends between the source and drain electrodes. As will be appreciated by the skilled reader, in this TFT configuration, the length 42 of the channel is not defined by a photolithographic process, as is the case for the TFT of FIG. 1, but is dictated by the height of the upper surface of the gate electrode 22 above the substrate 24.

Figure 3:
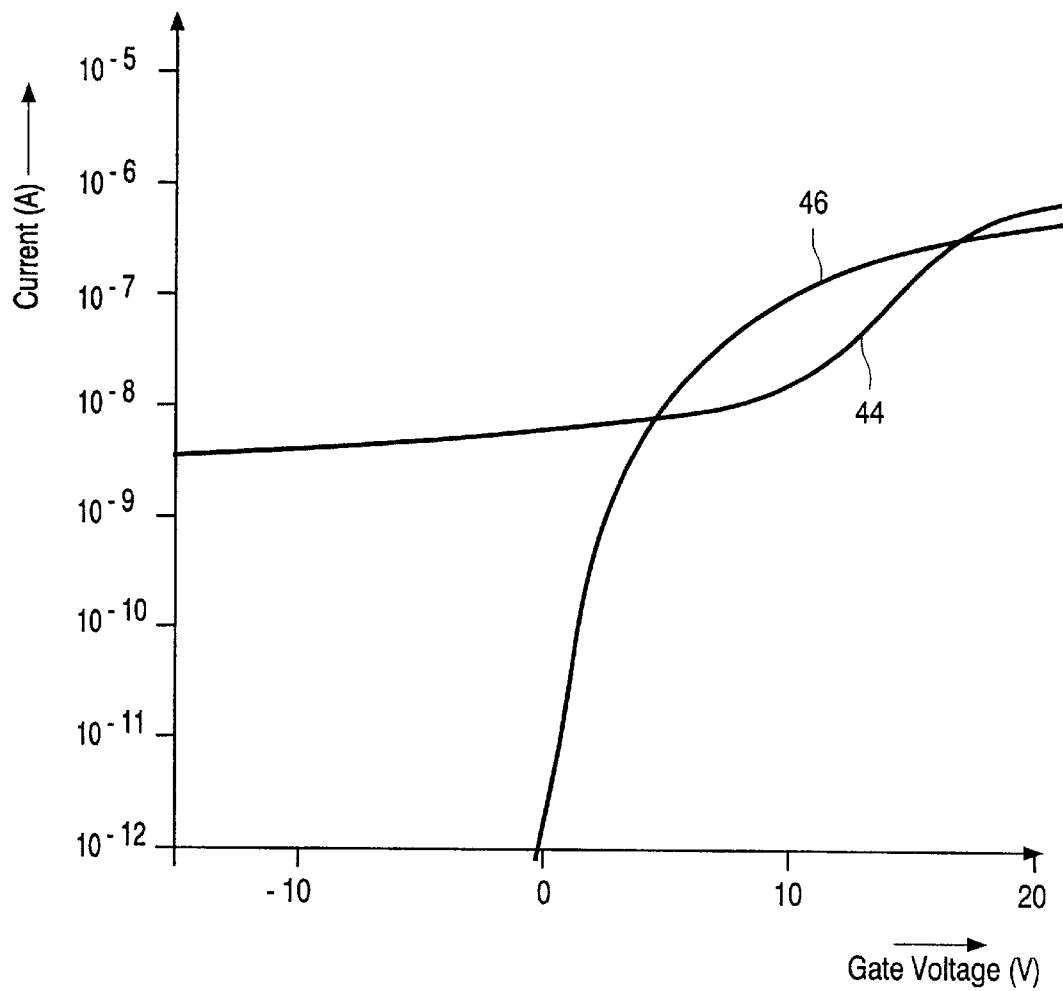
FIG. 3 is a graph of gate voltage against current for TFTs with different mobilities.

FIG. 3 shows plots of gate voltage against transistor current for two TFTs. The first, indicated by line 44, is for a TFT having a mobility of 0.8 $cm^2/Vs$ and a channel length of 1 micron. The second, indicated by line 46, is for a TFT having a mobility of 0.14 $cm^2/Vs$ and a channel length of 0.75 $\mu$m, thus embodying the present invention. Both sets of measurements were taken at a source-drain voltage of 10V. It can be seen that, at a gate voltage of −15V, line 44 indicates an off-current of about 3 nA, whilst line 46 indicates an off-current of below 1 pA. The off-current is therefore reduced by a factor of more than $10^3$, owing to the lower mobility of the second device.

Figure 4:
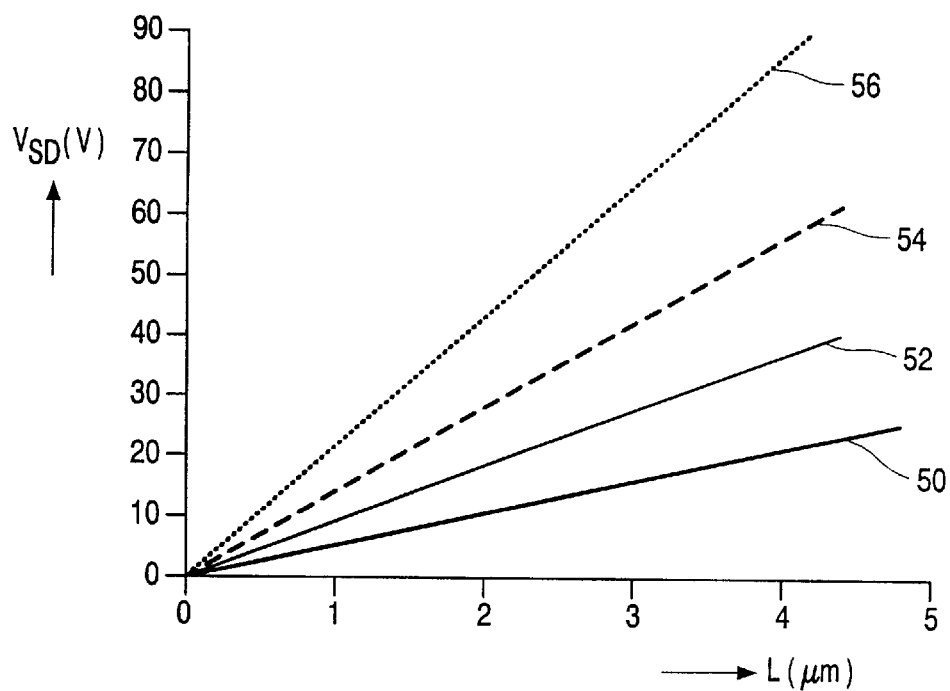
FIG. 4 is a graph of channel length, L, against the source-drain voltage at which a leakage current of 1 pA is reached, $V_{SD}$, for TFTs with different mobilities.

FIG. 4 shows a graph of channel length, L, against the drain voltage at which a leakage current of 1 pA is reached, $V_D$, for TFTs with different mobilities, as determined experimentally by the inventors. Lines 50, 52, 54 and 56 correspond to TFTs having mobilities of 0.80, 0.34, 0.14, and 0.01 $cm^2/Vs$, respectively. It can be seen that, as the mobility reduces, the drain voltage at which the leakage current threshold is reached increases.

Figure 5:
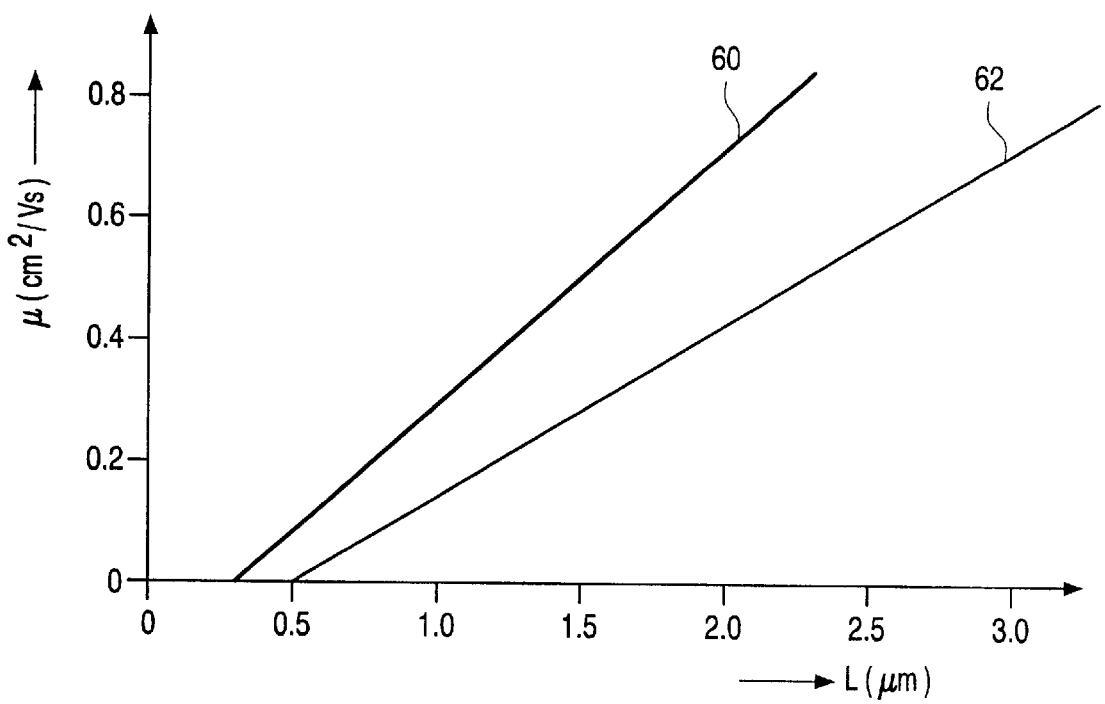
FIG. 5 is a graph of channel length, L, against mobility, $\mu$, of TFTs which reach a leakage current of 1 pA at different drain voltages.

Using the results shown in FIG. 4, FIG. 5 is a graph of channel length, L, against mobility, $\mu$, of TFTs which reach a leakage current of 1 pA at different drain voltages. Drain voltages of 10 and 15V correspond to lines 60 and 62, respectively. This serves to indicate combinations of short channel length and low mobility which provide an acceptable TFT performance at different maximum drain voltages.

From reading the present disclosure, other variations and modifications will be apparent to persons skilled in the art. Such variations and modifications may involve equivalent and other features which are already known in the design, manufacture and use of electronic devices comprising thin-film circuits, semiconductor devices, and component parts thereof, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

What is claimed is:

1. An electronic device including a thin film transistor comprising an insulated gate adjacent to a layer of semiconductor material for controlling a conduction channel in the semiconductor layer between source and drain regions, wherein the length of the channel of the transistor is 1 micron or less, and the mobility of the semiconductor material in the channel is less than 0.2 $cm^2/Vs$.

2. A device of claim 1 wherein the length of the channel of the transistor is around 0.75 micron or less.

3. A device of claim 1 wherein the length of the channel of the transistor is around 0.5 micron or less.

4. A device of claim 1 wherein the mobility of the semiconductor material in the channel is around 0.15 $cm^2/Vs$ or less.

5. A device of claim 1 wherein the mobility of the semiconductor material in the channel is around 0.1 $cm^2/Vs$ or less.

6. A device of claim 1 wherein the transistor is a vertical transistor.

7. A device of claim 1 wherein the semiconductor material comprises amorphous silicon.

8. A device of claim 1 wherein the semiconductor material comprises nanocrystalline silicon.

9. A device of claim 1 wherein the semiconductor material comprises organic material.

10. A device of claim 9 wherein the semiconductor material comprises polymeric material.

11. A device of claim 1 wherein the semiconductor material comprises an organic-inorganic hybrid material.

12. Use of an electronic device including a thin film transistor comprising an insulated gate adjacent to a layer of semiconductor material for controlling a conduction channel in the semiconductor layer between source and drain regions, wherein the length of the channel of the transistor is 1 micron or less, and the mobility of the semiconductor material in the channel is less than 0.2 $cm^2/Vs$, wherein the leakage current through the transistor at a predetermined source-drain voltage threshold and a predetermined gate voltage threshold is below a predetermined threshold.

13. Use of an electronic device according to claim 12 wherein the predetermined leakage current threshold is 1 pA.

14. Use of an electronic device according to claim 13 wherein the predetermined source-drain voltage threshold is 10V and the predetermined gate voltage threshold is −15V.

* * * * *